United States Patent [19]

Marks

[11] Patent Number: 5,758,273
[45] Date of Patent: May 26, 1998

[54] RECEIVER DYNAMIC RANGE EXTENSION METHOD

[75] Inventor: Scott Ensign Marks, Penfield, N.Y.

[73] Assignee: Harris Corporation, Melbourne, Fla.

[21] Appl. No.: 591,733

[22] Filed: Jan. 25, 1996

[51] Int. Cl.⁶ .................... H04B 1/06; H04B 7/00
[52] U.S. Cl. .................. 455/240.1; 455/234.2; 455/249.1
[58] Field of Search ............ 455/232.1–236.1, 455/240.1, 249.1, 250.1, 254, 310, 317

[56] References Cited

U.S. PATENT DOCUMENTS

| | | |
|---|---|---|
| 3,968,438 | 7/1976 | Thanos . |
| 4,000,369 | 12/1976 | Paul, Jr. et al. . |
| 4,083,009 | 4/1978 | Bickford et al. ............... 375/332 |
| 4,169,219 | 9/1979 | Beard . |
| 4,198,603 | 4/1980 | Aldridge et al. . |
| 4,270,222 | 5/1981 | Menant ......................... 455/249.1 |
| 4,301,445 | 11/1981 | Robinson . |
| 4,531,234 | 7/1985 | Bell . |
| 4,553,105 | 11/1985 | Sasaki ............................ 455/250.1 |
| 4,829,593 | 5/1989 | Hara ............................. 455/234.2 |
| 5,204,970 | 4/1993 | Stengel et al. ................... 455/69 |
| 5,204,976 | 4/1993 | Baldwin et al. . |
| 5,319,702 | 6/1994 | Kitchin et al. .................. 379/145 |
| 5,452,473 | 9/1995 | Weiland et al. ............... 455/234.2 |
| 5,507,023 | 4/1996 | Suganuma et al. ............ 455/249.1 |

FOREIGN PATENT DOCUMENTS 0196923 8/1989 Japan .

Primary Examiner—Reinhard J. Eisenzopf
Assistant Examiner—Sam Bhattacharya
Attorney, Agent, or Firm—Rogers & Killeen

[57] ABSTRACT

A system and method for adjusting the dynamic range of a receiver in a communication system in which an input signal is attenuated by a calculated amount before the input signal is provided to a mixer in the receiver. The attenuation amount is set so that reciprocal mixing noise caused by mixing the input signal with the local oscillator phase noise in the mixer is reduced until the total noise is the receiver noise floor (the sum of thermal noise and receiver noise figure), without degrading the signal-to-noise ratio of the input signal.

8 Claims, 1 Drawing Sheet

RECEIVER DYNAMIC RANGE EXTENSION METHOD

BACKGROUND OF THE INVENTION

The present invention is directed to methods and systems for improving performance of communication systems, and more particularly to a method and system for adjusting the dynamic range of an RF receiver in a communication system.

A receiver in a communication system typically has a mixer for receiving an input signal at a radio frequency and for providing an output at an intermediate frequency. The mixer mixes the input signal with a local oscillator (lo) signal to form the intermediate frequency (IF) signal.

The terms used herein may be defined as follows:

synthesizer phase noise—broadband phase noise in the lo signal that is imparted by the mixer to the IF signal, changes dB per dB with changes in the input signal level, in dBc/Hz (dB relative to a carrier for a one Hertz bandwidth signal);

ktB—measure of receiver thermal noise, in dBm/Hz (absolute dB above one milliwatt for a one Hertz bandwidth signal), by convention is −174 dBm/Hz at room temperature in a 50Ω system;

receiver noise figure (NF)—the relative noise added by the receiver that is a determinable value (including noise added in subsequent stages and referred back to the input), in dB;

receiver noise floor (ktB+NF) dBm/Hz—a measure of the total noise power present at the receiver that is a lower limit below which signals cannot be received, the sum of receiver noise figure and thermal noise, and the reciprocal mixing noise;

receiver dynamic range dB—a measure of range over which a receiver receives signals, a minimum ratio of input signal level to noise level below which signals cannot be received;

receiver intercept point—the third order intercept point (IP3), a measure of the linearity of the receiver input wherein larger values indicate lower levels of intermodulation distortion products, in dBm;

receiver (1 dB) compression point—a further measure of the linearity of the receiver input above which the receiver no longer linearly reproduces the input signal (the signal is being compressed by 1 dB), in dBm.

As is apparent from its definition, dynamic range decreases when the background noise level increases. Further, dynamic range decreases when there is an increase in the intermodulation distortion products caused by non-linearities in the receiver circuitry (as indicated by intercept and compression points), and when reciprocal mixing noise increases due to the presence of a strong interfering signal mixing with the synthesizer phase noise.

As is known, both intermodulation distortion products and reciprocal mixing noise may be reduced by attenuating the receiver input. However, attenuating the receiver input will also decrease the input signal level, and attenuating it by the wrong amount will decrease the dynamic range. The present invention is directed to a method and system for attenuating the receiver input by the correct amount so that the dynamic range is not decreased.

For example, it is known to adjust dynamic range by attenuating an input signal before the signal is fed to a mixer, and then to restore the signal to its original value after mixing. This method extends dynamic range by permitting the system to process stronger signals. However, there is no method for determining how much to attenuate the signal, and the method does not exploit characteristics of synthesizer phase noise. See U.S. Pat. No. 4,553,105 issued Nov. 12, 1985 to Sasaki.

There is a need to increase receiver dynamic range, but several factors are involved in the determination of dynamic range, most of which limit dynamic range only during particular circumstances. Thus, there is no practical need to increase performance of some parameters when the overall performance is being limited by other parameters. The present invention exploits the limitation on dynamic range imposed by synthesizer phase noise.

Accordingly, it is an object of the present invention to provide a novel system and method of adjusting the dynamic range of a receiver that obviates the problems of the prior art.

It is another object of the present invention to provide a novel system and method of adjusting the dynamic range of a receiver in which the input signal is attenuated by an amount that does not decrease the dynamic range.

It is yet another object of the present invention to provide a novel system and method of adjusting the dynamic range of a receiver in which the input signal is attenuated so that reciprocal mixing noise is reduced until the total noise is at the receiver (thermal) noise floor.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
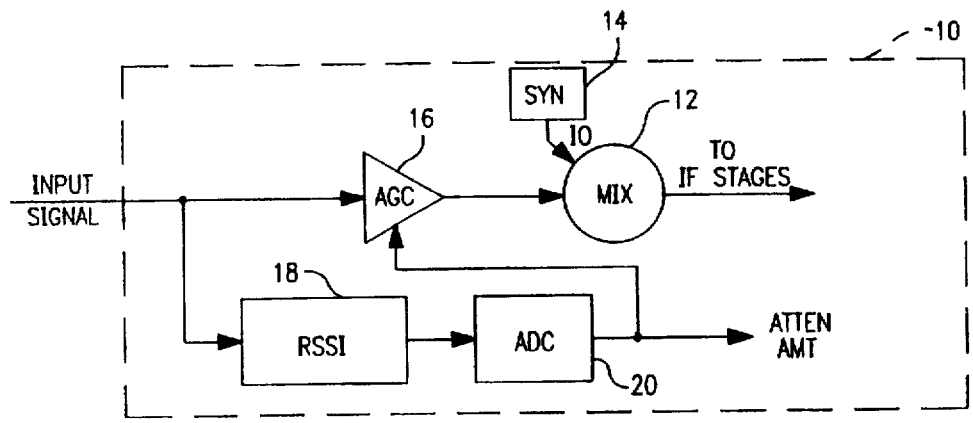
FIG. 1 is a partial circuit diagram illustrating an embodiment of the present invention.

In an embodiment of the present invention and with reference to FIG. 1, a receiver 10 in a communication system includes a mixer 12 for converting an input signal frequency to an intermediate frequency (IF) signal. Mixer 12 is provided with a local oscillator (lo) signal from a synthesizer 14 that unavoidably includes synthesizer phase noise at a predetermined level which is imparted to the IF signal by mixer 12 (known as reciprocal mixing). The input signal is attenuated in an attenuator 16 before the input signal is provided to mixer 12 by an amount so that synthesizer phase noise imparted by mixer 12 is reduced until the total receiver noise is at the receiver noise floor.

The amount attenuated by attenuator 16 may be determined in a received signal strength indicator 18 that receives the input signal. Indicator 18 dynamically determines the maximum attenuation that can be imparted by attenuator 16 in order to maintain synthesizer phase noise low enough so that it is no longer a significant factor in total receiver noise.

By way of further explanation, consider the following example. A standard measure of receiver sensitivity is a 10 dB signal-to-noise ratio (SNR) measured in a 3 KHz bandwidth. Thermal noise, ktB, is −174 dBm/1 and is −139 dBm/3 KHz for the standard 3 KHz bandwidth (the noise power difference between a 1 Hz bandwidth and a 3 KHz bandwidth is 35 dB.) If a receiver has a 10 dB noise figure, the receiver noise floor for a 3 KHz bandwidth is −129 dBm/3 KHz. If the receiver is to have a 10 dB SNR for received signals, a minimum signal level of −119 dBm would be needed. The receiver noise floor (due to thermal noise) of −129 dBm/3 KHz remains constant, and increases in signal level improve the quality of the signal presented to the user.

Now consider what happens when synthesizer phase noise is imparted by the mixer. Synthesizer phase noise is a determinable parameter for each receiver, and is −105 dBc/3 KHz in this example. Synthesizer phase noise will be imparted to the input signal at a level of −105 dB/3 KHz, or 105 dB below the signal level, in a 3 KHz bandwidth. This means that any signal at the receiver input greater than −24 dBm will have an associated noise floor due to reciprocal mixing greater than the −129 dBm/3 KHz noise floor due to thermal noise. In fact, since the noises are additive, any signal greater than −29 dBm will undesirably increase the receiver total noise floor above −129 dBm/3 KHz. (One of the solutions to this problem is to improve synthesizer performance by reducing its phase noise, a solution not addressed herein in which a level of synthesizer performance is given.)

Figure 2:
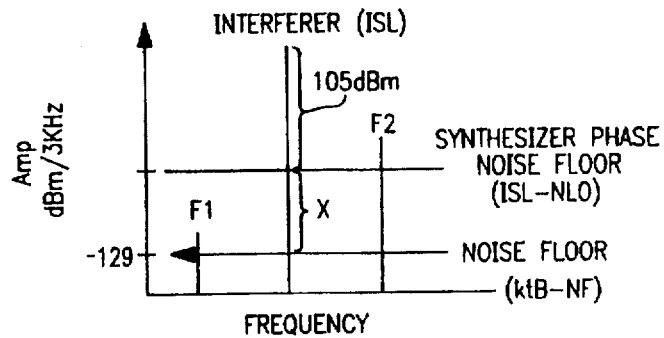
FIG. 2 is a graphic depiction of the effect of synthesizer phase noise on receiver noise floor.

This may be seen graphically in FIG. 2 in which two input signal levels F1 and F2 are shown. Both signal levels exceed the receiver (thermal) noise floor of −129 dBm/3 KHz (ktB+Receiver Noise Figure NF) and would be detected were it not for an interferer signal with signal level ISL greater than −29 dBm. While the interferer does not directly effect either F1 or F2, its addition causes reciprocal mixing noise to increase the effective noise floor to 105 dB/3 KHz below the ISL, that is, to ISL minus 105 dB/3 KHz (denoted NLO in FIG. 2). Only signal F2 has a signal level that exceeds the effective noise floor and is detectable.

In FIG. 2 it may seen that the effective noise floor is increased by synthesizer phase noise by an amount X above the receiver noise floor (ktB+NF). As will be shown, the input signal level can be attenuated by an amount which reduces X to zero and which does not decrease receiver dynamic range.

As noted above, dynamic range is also effected by nonlinearities, as reflected in intercept and compression point values. The presence of strong, undesired signals at the receiver input will generate distortion products which may interfere with the reception of weaker desired signals. To the extent that these products interfere with a particular signal, dynamic range is reduced. Distortion products are generated rapidly with increasing interfering signal level (ISL), and will, conversely, dissipate rapidly as ISL is reduced. Accordingly, one of the known methods of reducing distortion products is to add attenuation, even though the receiver noise figure will increase dB for dB by the amount attenuated.

By way of further explanation, IP3 is defined as the signal level at which the level of the third order intermodulation distortion (IMD) products will be equal to the level of the interfering signals which cause the products. The distortion products increase as the cube of the increase in the level of the interfering signals (ISL). The ratio of ISL to the IMD products is denoted IMDR and is related to IP3 and ISL by:

IMDR=2(IP3−ISL) or IP3=IMDR/2+ISL

If the mixer IP3 were +0 dBm and the ISL of two interferers is 0 dBm each, then the mixer IMDR would be −40 dB. If the interferers are attenuated to −10 dm before reaching the mixer, the mixer IMDR is reduced to −60 dBm. However, while the IP3 of the mixer remains +20 dBm, the IP3 of the combination of the attenuator and the mixer has increased to +30 dBm, a 10 dB improvement over the +20 dB IP3 of the mixer alone. Thus the IP3 of a system will increase by the amount of attenuation added before mixing.

Figure 3:
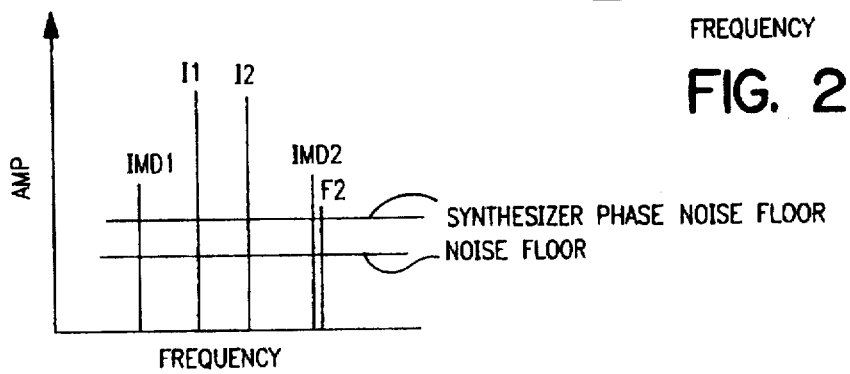
FIG. 3 is a graphic depiction of the effect of intermodulation distortion products.
Figure 4:
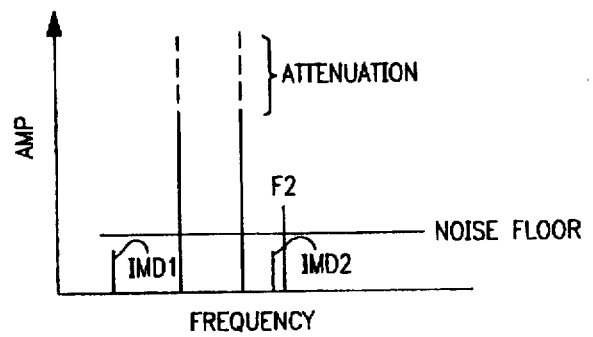
FIG. 4 is a graphic depiction of the effect of the present invention on intermodulation distortion products.

With reference to FIG. 3, two interferers I1 and I2 generate IMD products IMD1 and IMD2, where the effect on signal F2 is obvious. In FIG. 4, the input has been attenuated prior to the mixer, with resulting reduction in the IMD products level. The attenuation amount in FIG. 4 is the amount needed to reduce the total noise level to the receiver noise level ktB+NF. Even though the signal level of the input has been reduced, the SNR is the same as in FIG. 3. In fact, the dynamic range has actually increased because the IMD product level which interferes with F2 has been decreased so that F2 becomes useable at a lower signal level.

The method of calculating the correct attenuation amount is dependent on the known level of the synthesizer phase noise (NLO), and the known level of the receiver noise floor (ktB+NF). As illustrated above, to avoid increasing the effective receiver noise floor, reciprocal mixing noise is desirably held approximately 5 dB below it. Reciprocal mixing noise caused by an interfering signal is ISL−NLO, thereby providing the following:

ISL−NLO=ktB+NF−5 or, ISL=ktB+NF −5+NLO

This means that in order to preserve the receiver (thermal) noise floor, input signal levels are desirably below:

(ktB+NF −5+NLO) dBm

From the earlier example, this signal level is:

(−139+10−5+105)=−29 dBm

This calculation may be performed in received signal strength indicator 18 in FIG. 1 which provides an attenuation amount to attenuator 16. Continuing the example, indicator 18 may set a signal threshold of −29 dBm, and any input signal level above −29 dBm would be attenuated by attenuator 16, effectively increasing the receiver noise figure NF, so that the input signal level to mixer 12 remains at or below −29 dBm.

A preferred embodiment of the invention may be employed in a digital receiver and in this embodiment attenuator 16 may be a conventional binary weighted digital gain control device (e.g., switched RF attenuator). Indicator 18 may be analog and an analog to digital converter 20 may be provided to quantify an output voltage from indicator 18 and send digital signals indicating the attenuated amount to attenuator 16 and to other components, as discussed below. A digital bus may be provided between converter 20 and attenuator 16 that may be controlled with a separate control processor (not shown) to scale the signal. Alternatively, scaling and control may added to indicator 18 to reduce computational bandwidth requirements for the control processor.

The output bandwidth of indicator 18 determines the sampling rate required in converter 20, as well as the maximum gain change rate. For optimum floating point signal path digitizing, converter 20 may be synchronized with an IF analog-to-digital converter typically found in such receivers. Of course, consideration should be given to the effect of attenuator 18 switching transients and gain errors on the accuracy of the floating point value.

In the digital embodiment of the present invention the precise knowledge of the attenuation adjustment made by attenuator 16 may also be made available to subsequent normalization algorithms.

The output of indicator 18 may also be used to extend the dynamic range of a signal digitizer by providing the equivalent to a floating point conversion. The attenuated amount would provide the floating point exponent and the IF digitizer would provide the mantissa.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of adjusting dynamic range of a receiver in a communication system, the method comprising the steps of:
   (a) providing a local oscillator signal to a mixer in the receiver, the mixer for converting a frequency of an input signal of signal level (ISL) to an intermediate frequency, the local oscillator signal including a broadband phase noise at a predetermined level (NLO) that is part of a reciprocal mixing noise (ISL -NLO) in the mixer;
   (b) attenuating the input signal before the input signal is provided to the mixer when the reciprocal mixing noise is a lower limit of the dynamic range of the receiver, the input signal being attenuated by an amount so that the reciprocal mixing noise level is reduced and is less than the receiver noise floor; and
   (c) increasing a high end of the dynamic range of the receiver by an amount substantially the same as the attenuated amount.

2. The method of claim 1 wherein the input signal is attenuated so the reciprocal mixing noise is about 5 dB below the receiver noise floor.

3. The method of claim 1 wherein the attenuated amount is at least the difference between the input signal level and a predetermined amount which is the sum of a predetermined receiver noise floor and NLO.

4. The method of claim 1 further comprising the step of providing the attenuated amount to a normalization algorithm.

5. The method of claim 1 wherein the receiver is an IF signal digitizer and wherein the attenuated amount is a floating point exponent.

6. A device for controlling dynamic range of a receiver with an intermediate frequency (IF) mixer in a communication system, the device comprising:
   an attenuator for receiving an input signal of level ISL to a receiver in a communication system and for providing an attenuated signal to an IF mixer in the receiver;
   said mixer for receiving a local oscillator signal of level NLO from a synthesizer and having a reciprocal mixing noise of ISL minus NLO; and
   a signal strength indicator for receiving the input signal and for calculating an amount the input signal is to be attenuated, said indicator being connected to said attenuator for providing the calculated amount thereto,
   the calculated amount increasing the attenuation of the input signal when the reciproal mixing noise is greater than the receiver's thermal noise floor so that the reciprocal mixing noise is less than the receiver noise floor.

7. The device of claim 6 wherein said signal strength indictator calculates an attentuation amount so the reciprocal mixing noise is about 5 dB less than the receiver noise floor.

8. The device of claim 6 further comprising an analog to digital converter for converting an output from said signal strength indicator to a digital signal for said attenuator.

* * * * *